US008823150B2

(12) United States Patent
Tanaka et al.

(10) Patent No.: US 8,823,150 B2
(45) Date of Patent: Sep. 2, 2014

(54) OPTICAL MODULE WITH A LENS ENCAPSULATED WITHIN SEALANT AND METHOD FOR MANUFACTURING THE SAME

(75) Inventors: Kazunori Tanaka, Yokohama (JP); Kazuaki Mii, Yokohama (JP); Toshio Takagi, Yokohama (JP); Tomomi Sano, Yokohama (JP); Keitaro Koguchi, Chigasaki (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/805,260

(22) PCT Filed: Jul. 4, 2011

(86) PCT No.: PCT/JP2011/065743
§ 371 (c)(1), (2), (4) Date: Dec. 18, 2012

(87) PCT Pub. No.: WO2012/005370
PCT Pub. Date: Jan. 12, 2012

(65) Prior Publication Data

US 2013/0093071 A1 Apr. 18, 2013

(30) Foreign Application Priority Data

Jul. 7, 2010 (JP) ................................ 2010-154632
Feb. 9, 2011 (JP) ................................ 2011-025566
Feb. 28, 2011 (JP) ................................ 2011-041578

(51) Int. Cl.
*H01L 23/495* (2006.01)

(52) U.S. Cl.
USPC ............................ 257/666; 257/432; 257/433

(58) Field of Classification Search
USPC ............. 257/81, 99, 100, 432, 433, 434, 666, 257/787
See application file for complete search history.

(56) References Cited

U.S. PATENT DOCUMENTS 5,175,783 A 12/1992 Tatoh
6,879,040 B2 * 4/2005 Ng et al. ....................... 257/730
7,179,680 B2 * 2/2007 Fries ............................ 438/106

(Continued)

FOREIGN PATENT DOCUMENTS

CN 101335319 A 12/2008
CN 101959666 A 1/2011

(Continued)

OTHER PUBLICATIONS

Office Action in Chinese Patent Application No. 201180033626.7, dated Apr. 3, 2014.

*Primary Examiner* — Sheila V Clark
(74) *Attorney, Agent, or Firm* — Venable LLP; Michael A. Sartori; George L. Howarah

(57) ABSTRACT

A method to manufacture an optical module is disclosed, wherein the optical module has an optically active device on a lead frame and a lens co-molded with the active device and the lead frame by a transparent resin as positioning the lens with respect to the lead frame. The molding die of the present invention has a positioning pin to support the lens during the molding. Because the lead frame is aligned with the molding die, the precise alignment between the active device on the lead frame and the lens is not spoiled during the molding.

7 Claims, 8 Drawing Sheets

(56) References Cited

U.S. PATENT DOCUMENTS

| | | | | |
|---|---|---|---|---|
| 7,397,023 | B2 * | 7/2008 | Tsukamoto et al. | 250/239 |
| 7,723,146 | B2 * | 5/2010 | Chow et al. | 438/64 |
| 2003/0059177 | A1 | 3/2003 | Suzuki et al. | |
| 2004/0095502 | A1 * | 5/2004 | Losehand et al. | 348/340 |

FOREIGN PATENT DOCUMENTS

| | | |
|---|---|---|
| EP | 0 450 560 | 10/1991 |
| JP | 10-307237 | 11/1998 |
| JP | 2004-133117 | 4/2004 |
| JP | 2010-045108 | 2/2010 |

* cited by examiner 53
2
53e
53e
89c
89c
89b
89b
4
89
89a
89a

OPTICAL MODULE WITH A LENS ENCAPSULATED WITHIN SEALANT AND METHOD FOR MANUFACTURING THE SAME

TECHNICAL FIELD

The present invention relates to an optical module, in particular, the invention relates to an optical module and a method for manufacturing the module that encapsulates a lens with a transparent sealant.

BACKGROUND ART

The optical module to transmit and/or receive optical signals, generally includes a package that installs semiconductor optical devices, such as a semiconductor laser diode (hereafter denoted as LD) or a semiconductor photodiode (hereafter denoted as PD), and an optical receptacle to couple the semiconductor optical device with an external fiber.

One type of the optical module has an arrangement that the semiconductor optical device is mounted on a lead frame, and both of them are encapsulated with a transparent resin. A Japanese Patent Application published as JP-2004-133117A has disclosed such an optical module that encapsulates a lens, in addition to the optical device and the lead frame, within the sealant to compensate the degradation of the optical coupling between the optical device and the external fiber due to larger temperature dependence of the refractive index of the transparent resin to encapsulate the members. However, the lens encapsulated in the sealant is easily misaligned by the fluid resin during the molding, which increases the optical coupling loss between the device and the external fiber.

SUMMARY OF INVENTION

An aspect of the present invention relates to an optical module that comprises a semiconductor optical device, a lead frame, a lens, and a sealant. The semiconductor optical device may be an LD or a PD. The lead frame mounts the semiconductor optical device. The lens is optically coupled with the semiconductor optical device. The sealant encloses the semiconductor optical device, the lens, and a portion of the lead frame, where the sealant is transparent for light characterizing the semiconductor optical device. A feature of the present invention is that the sealant has at least a via penetrating from a surface thereof to the lens.

Because the sealant has the via in a vicinity of the semiconductor optical device in the present invention, heat generated by the semiconductor optical device may be efficiently dissipated.

Another aspect of the present invention relates to a method to manufacture an optical module. The method comprises steps of: (a) setting a lead frame on a molding die, where the lead frame mounts a semiconductor optical device thereon; (b) supporting a lens by a portion of the molding die in a position optically aligned with the semiconductor optical device; and (c) molding the lens, the semiconductor optical device, and the lead frame by a resin transparent for light characterizing the semiconductor optical device.

Because the process according to the present invention supports the lens by, for instance, a positioning pin protruding within a cavity of the molding die, and the lead frame is also placed on the molding die; the lens may be aligned with the semiconductor optical device through the molding die. Moreover, because the lens is supported by the positioning pin, the alignment of the lens against the semiconductor optical device may be maintained during the injection of the resin into the cavity.

BRIEF DESCRIPTION OF DRAWINGS

The invention may be more completely understood in consideration of the following detailed description of various embodiments of the invention in connection with the accompanying drawings, in which:

FIGS. 2A to 2C are a plan view, a side view, and a front view of the optical module shown in FIG. 1, wherein FIG. 2B illustrates an edge of an external fiber;

DESCRIPTION OF EMBODIMENTS

First Embodiment

Figure 1:
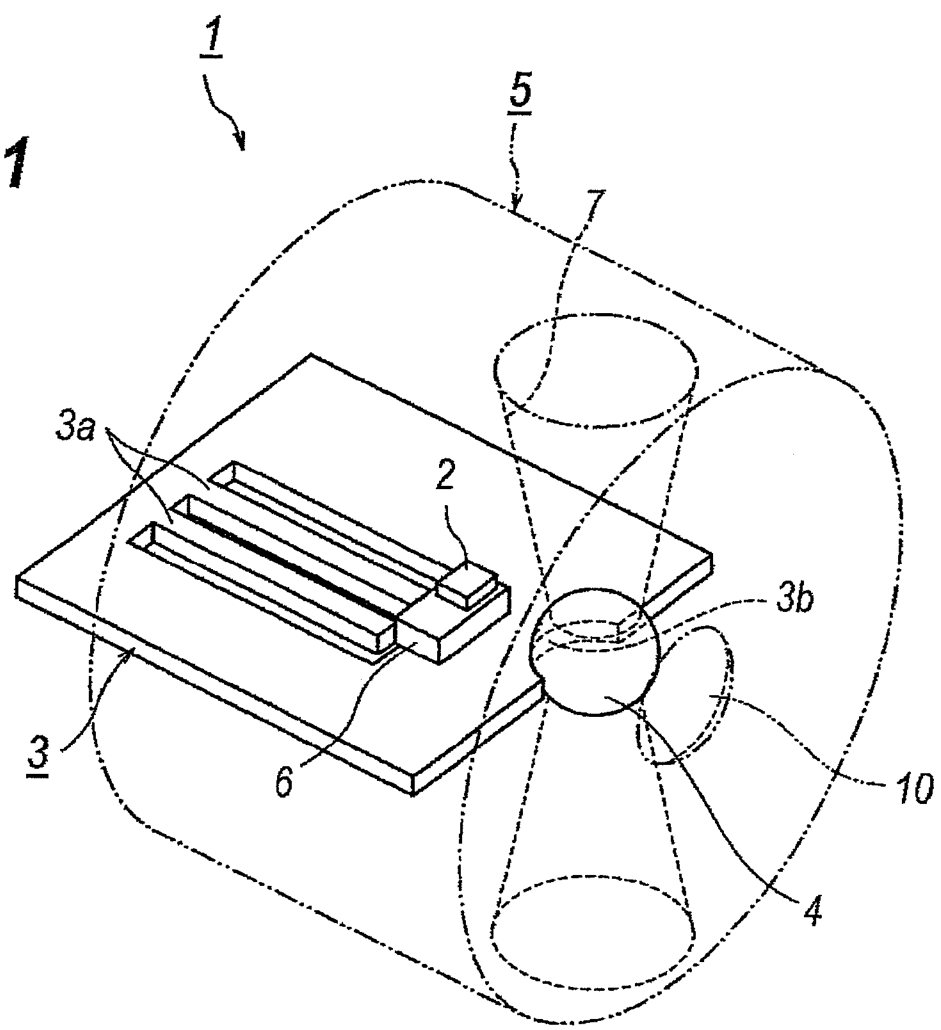
FIG. 1 is a perspective view of an optical module according to an embodiment of the present invention.
Figure 2A:
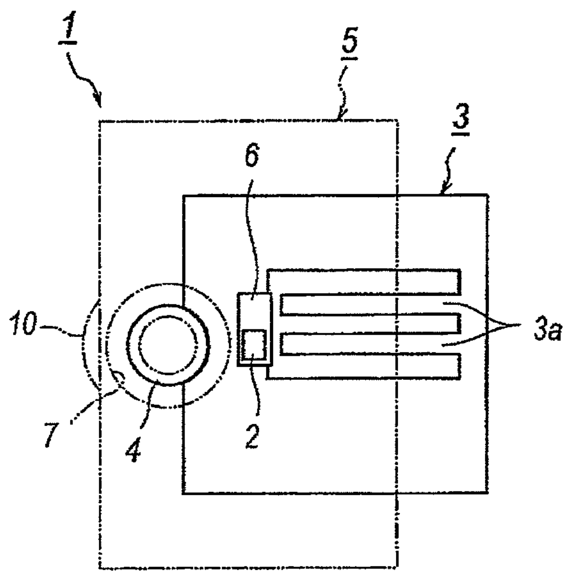
Figure 2B:
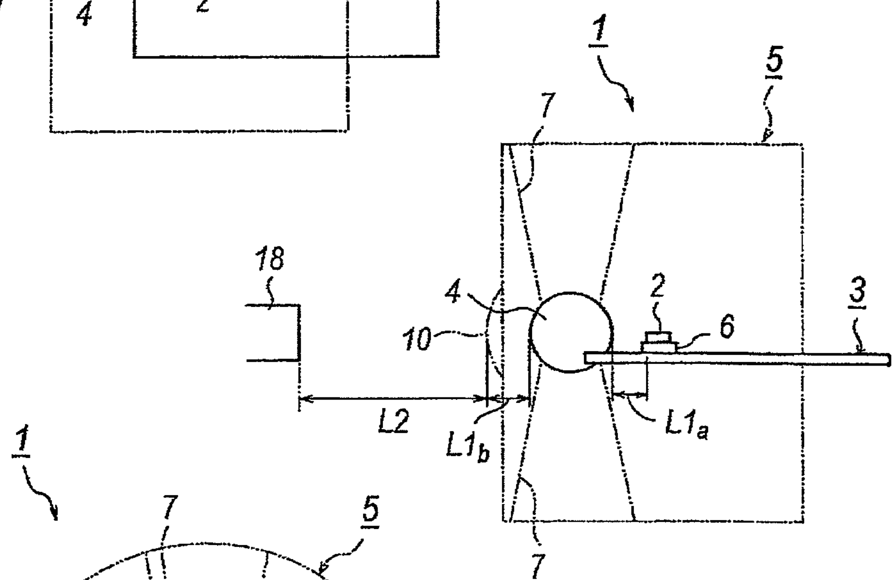
Figure 2C:
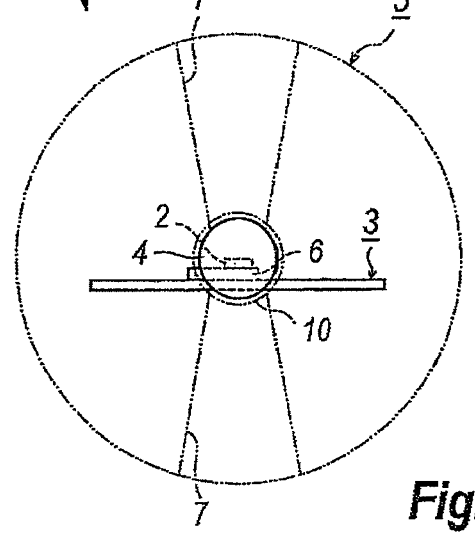

Next, preferred embodiments according to the present invention will be described as referring to accompanying drawings. FIG. 1 shows an outer appearance of an optical module according to the first embodiment of the present invention; and FIGS. 2A to 2C show a plan view, a front view, and a side view of the optical module, respectively.

The optical module 1 of the present embodiment includes a light-emitting device, typically an LD 2 having a multi-quantum well active layer, a lead frame 3, a lens 4, a sealant 5, and a sub-mount 6. The sealant 6 includes a lens portion 10 and vias 7, details of which will be described later. The lens portion 10 is formed in an outer surface of the sealant 5 in a portion crossing an axis connecting the LD 2 with the lens 4

The lead frame 3, typically made of copper or copper alloy, has a substantially rectangular shape. The lead frame 3 mounts the LD 2 through the sub-mount 6 thereon. One side of the lead frame 3 includes a plurality of lead terminals 3*a*, which will be finally separated to each others; while, the other side of the lead frame includes a cut 3*b* with a semi-circular shaper. The LD 2 is wire-bonded to one of lead terminals 3*a*. The cut 3*b* receives the lens 4 so as to align the lens 4 optically on the axis of the LD 2.

The lens 4, which may be made of material with refractive index greater than that of a material for the sealant 5, has convex surface to concentrate light emitted from the LD 2. Specifically, the lens 4 may be a spherical lens made of BK7 or TAF3 with a diameter of 0.5 to 1.5 mm. Further, the lens 4 may position such that a distance $L_{1a}$ from the lens 4 to the LD 2 is set to be 0.3 mm, while, another distance $L_{1b}$ from the lens 2 to the lens portion 10 is set to be 2.4 mm. Exactly, the former distance $L_{1a}$ is from the surface of the lens 4 closest to the LD 2 to the front edge of the LD 2, while, the latter $L_{1b}$ is from the surface of the lens 4 closest to the lens portion 10 to the top of the lens portion 10. These distances are an exemplary of the optical design; and may vary depending on the characteristics of the LD 2, the lens 4, and the lens portion 10.

The shape of the sealant 5 is a pillar having an axis substantially in parallel to the axis connecting the LD 2 with the lens 4. The pillar may have a diameter of 5 to 20 mm and a length 5 to 20 mm. The sealant 5, for instance, may be made of resin, such as epoxy resin, substantially transparent in wavelengths of the LD 2. The sealant 5 seals at least the lens 4 and a portion of the lead frame 3 where the LD 2 is mounted. The sealant 5 has two vias 7 each penetrating from the top and bottom surfaces, respectively, to the lens 4. The shape of the via 7 is a truncated cone.

The sealant 5 has the lens portion 10 in one end thereof. The lens portion 10 may concentrate light emitted from the LD 2 and transmitted through the lens 4. The sealant has the refractive index of 1.51 less than that of the lens 4. The optical axis of the lens portion 10 is aligned with the axis of the lens 4, that is, the sealant 5 is formed such that the axis of the lens portion 10 aligns with the axis of the lens 4. A distance $L_2$ from the lens portion 10, exactly, the top of the lens portion 4, to the ferrule 18 is set to be 2.4 mm in the present embodiment.

Figure 3:
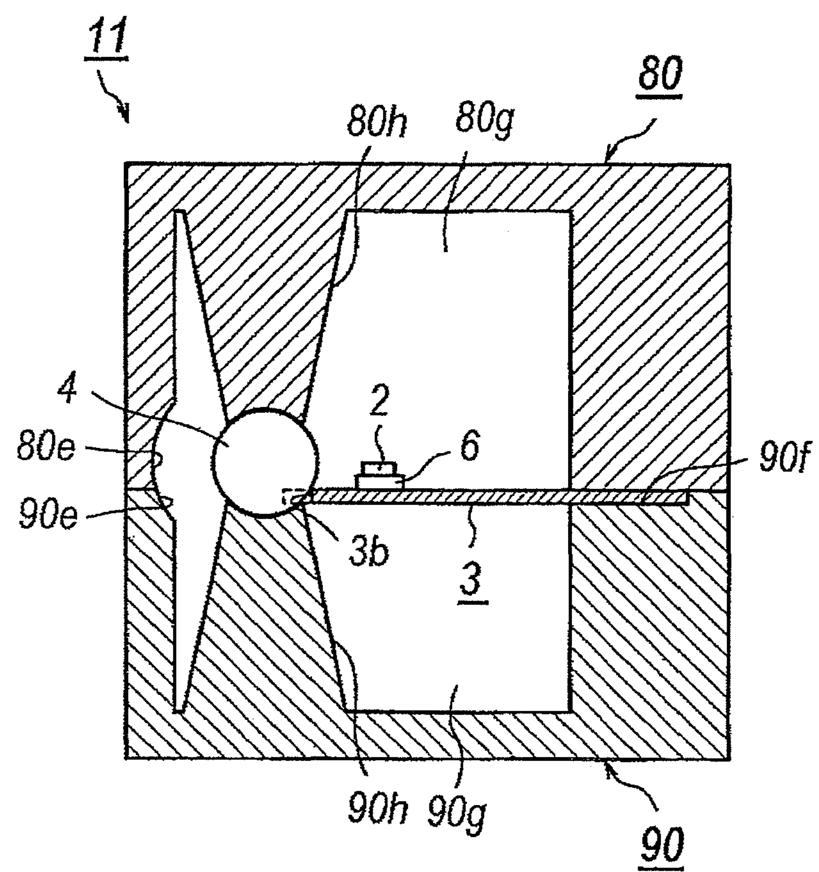
FIG. 3 is a side cross section of dies used in the manufacturing of the optical module shown in FIG. 1.

Next, a manufacturing method of the optical module 1 will be described as referring to FIG. 3. First, details of the molding die 11 for the transfer molding will be described. The die 11, as shown in FIG. 3 that shows a cross section of the die, includes an upper die 80 and a lower die 90. The lower die 90 includes a concaved surface 90*e*, a support terrace 90*f* where the lead frame 3 is set thereon, and a positioning pin 90*h*. The concaved surface 90*e* forms a portion of the lens portion 10. The positioning pin 90*h*, which may set the position of the lens 4 by supporting it from the lower side, has a shape of a truncated cone protruding from the bottom of the lower die 90. The top of the positioning pin 90*h* has a concave surface that fits with an outer shape of the lens 4. The lens 4 is placed on the positioning pin 90*h*.

The upper die 80 has a concaved surface 80*e* and a positioning pin 80*h*. The concaved surface 80*e* of the upper die 80, continuous from the concaved surface 90*e* of the lower die 90, forms the lens portion 10. The positioning pin 80*h*, which has a mirrored shape with respect to the positioning pin 90*h* of the lower die 90, may align the lens 4 in a preset position.

The positioning pins, 80*h* ad 90*h*, put the lens 4 therebetween; specifically, the positioning pin 90*h* of the lower die 90 supports the lens 4 from the bottom, while, the other positioning pin 80*h* in the upper die securely positions the lens 4 from the upper by pressing the lens against the lower positioning pin 90*h*. The tip of the positioning pins, 80*h* and 90*h*, are precisely formed so as not to cause any mechanical damage against the lens 4. The positioning pins, 80*h* and 90*h*, may have a mechanism to move in up-and-down and be processed in water repellant in surfaces thereof.

Next, a process to form the sealant 5 by the transfer molding will be described. First, the lead frame 3 is set on the support terrace 90*f* of the lower die 90. Then the lens 4 is placed on the top of the lower positioning pin 90*h*, in this instance, the lens 4 is supported by the lower positioning pin 90*h* from the bottom, while, it is positioned by the cut 3*b* of the lead frame 3 from the side. Then, fitting the upper die 80 with the lower die 90, the lens 4 may be supported and positioned by the upper positioning pin 80*h*.

Mounting the die 11 on an apparatus of the transfer molding, and performing the transfer molding; the cavities, 80*g* and 90*g*, may be filled with resin. Because the sealant 5 formed by the transfer molding often includes voids therein, the transfer molding of the present invention may be carried out such that the cavities, 80*g* and 90*g*, are first depressurized; subsequently, fluid resin is pressure-injected.

Preferable conditions of the transfer molding are follows, but unlimited to those conditions:

Tightened force for the molding dies: 1.0 to $1.6\times10^3$ kg, preferably 1.0 to $1.2\times10^3$ kg;

Curing time: 3 to 10 minutes, preferably, 5 to 7 minutes; and

Curing temperature: 155 to 180° C., preferably, 155 to 165° C.

After the molding, the optical module 1 may be removed from the dies, 80 and 90. Because the positioning pins, 80*h* and 90*h*, are processed in water repellant in surfaces thereof; the module 1 may be easily removed from the dies, 80 and 90. The module 1 is preferably set under a condition of a temperature of 150 to 165° C. for several hours to harden the resin further.

The optical module 1 thus transfer-molded may align the lens 4 optically with respect to the LD 2 mounted on the lead frame 3, because the lens 4 is supported by three members of two positioning pins, 80*h* and 90*h*, and the cut 3*b* of the lead frame 3 during the molding. Tri-points supporting described above may prevent the lens from being affected by a flow of the fluid resin. Thus, the lens 4 may be precisely aligned with the LD 2 even the lens 4 has a body different from the resin.

The present embodiment supports the lens 4 by three members of two positioning pins, 80*h* and 90*h*, and the cut 3*b* of the lead frame 3. However, only two positioning pins, 80*h* and 90*h*, may support the lens 4 during the molding, when the cut 3*b* is hard to be provided by the arrangement of the LD 2 on the lead frame 3 and the melted resin has viscosity not to affect the position of the lens 4.

The optical module 1 thus processed, as illustrated in FIG. 1, two vias 7 which are cast-offs of the positions pins, 80*h* and 90*h*, are formed in the sealant 5 in positions symmetry with respect to the lens 4. The optical module 1 of the present embodiment is preferable to fill the vias 7 with a member having a good thermal conductivity to accelerate the head dissipation; because the LD 2 generates heat and the sealant 5 made of transparent resin has relatively lesser thermal conductivity. The heat generated by the LD 2 may accumulate around the LD 2. Moreover, the LD 2 is a device whose performance strongly depends on the temperature. Accordingly, the member filling the vias 7 may accelerate the heat dissipation from the LD 2 to the outside of the sealant 5. The member may have a shape tracing the inner shape of the vias 7 and fixed thereat by an adhesive. The member may be made of metal such as aluminum or copper.

In such an arrangement of the heat dissipating member in the vias 7, the heat generated by the LD 2 may be not only conducted to the sealant 5 around the LD 2 but transferred to the heat dissipating member, which may suppress the degradation of the LD 2 in a long term by being affected from the heat generated by itself.

Figure 4:
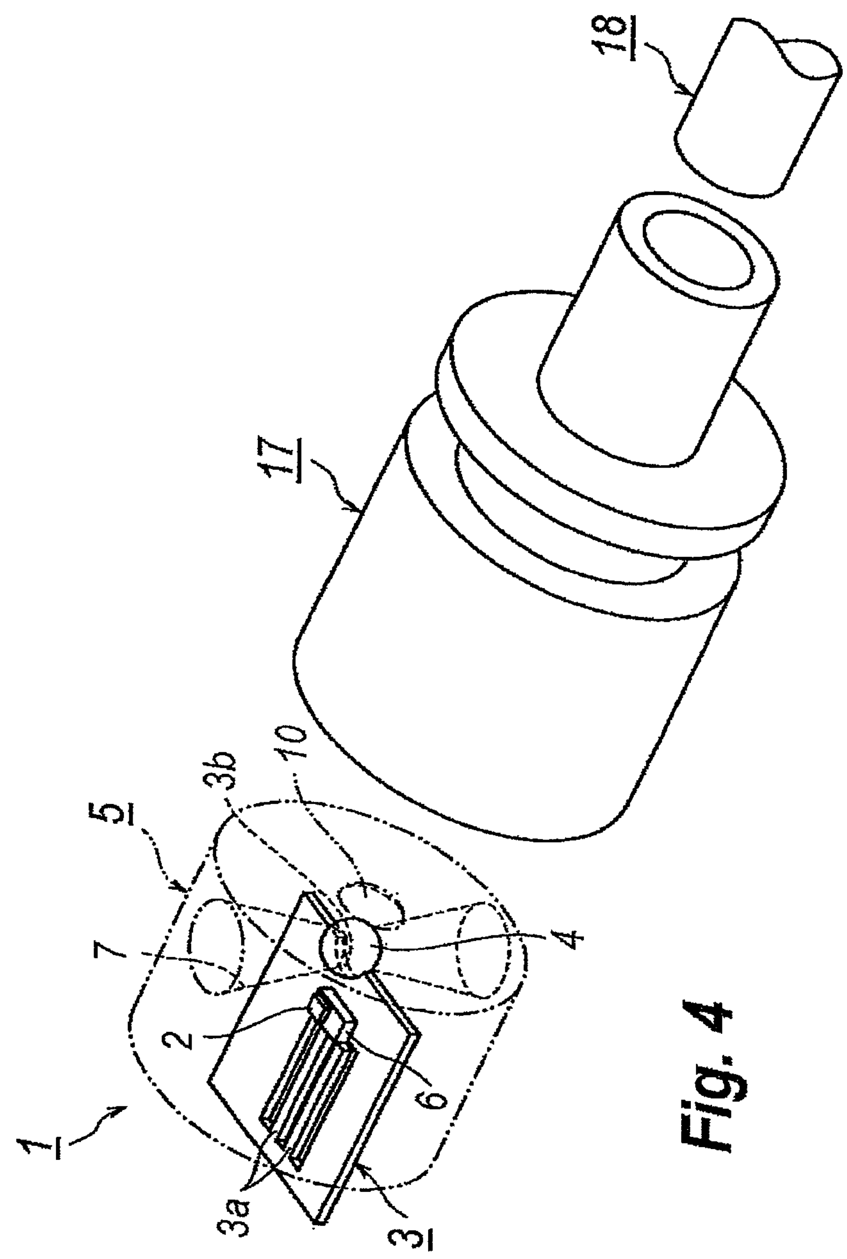
FIG. 4 is a perspective view showing a process to assemble the optical module with a sleeve.

Next, an optical coupling mechanism of the optical module 1 of the present embodiment will be described as referring to FIG. 4. The optical module 1, as shown in FIG. 4, is set within a sleeve 17, and the sleeve 17 may receive ferrule 18 therein to couple an external optical fiber secured in a center of the ferrule 18 optically with the LD 2.

The sleeve 17 may be made of metal, such as stainless steel, or resin such as polyetherimide. One of bores of the sleeve 17 that receives the optical module 1 therein has a shape fit with the pillared shape of the optical module 1, and an adhesive such as epoxy resin may fix the optical module 1 within the bore of the sleeve 17. Thus, the optical module 1 may be optically aligned with the external fiber within a gap between the outer surface of the sealant 5 and the bore of the sleeve 17.

Next, the optical coupling loss was compared for optical modules with various arrangements. The first module fixed the lens 4 to the lead frame 3 by an adhesive then it is molded, the second one supported the lens 4 only by the cut 3*b* of the lead frame 3 without any positioning pins during the molding, and the third one supported the lens 4 by the cut 3*b* and two positioning pins, 80*h* and 90*h*, during the molding. Three types of the module mentioned above were compared by the optical output power when a preset current is supplied to the LD 2. The first module indicated an average optical output of about 0.4, the second one indicated 0.7 and the third module was about 0.9, where they assumed the optical output obtained from the bared LD supplied with the preset current is 1.0.

Thus, the optical module 1 according to the present embodiment positions the lens 4 by three members, namely two positioning pins, 80*h* and 90*h*, and the cut 3*b* of the lead frame 3; accordingly, the lens 4 may be precisely aligned with the LD 2 on the lead frame 3. The mechanism to position the lens 4 with respect to the LD 2 is not restricted to those arrangement described above. Only two members, namely, two positioning pins, 80*h* and 90*h*, without the cut 3*b* may position the lens 2 with sufficient accuracy. Moreover, only the lower positioning pin 90*h* may align the lens 4.

Second Embodiment

Figure 5A:
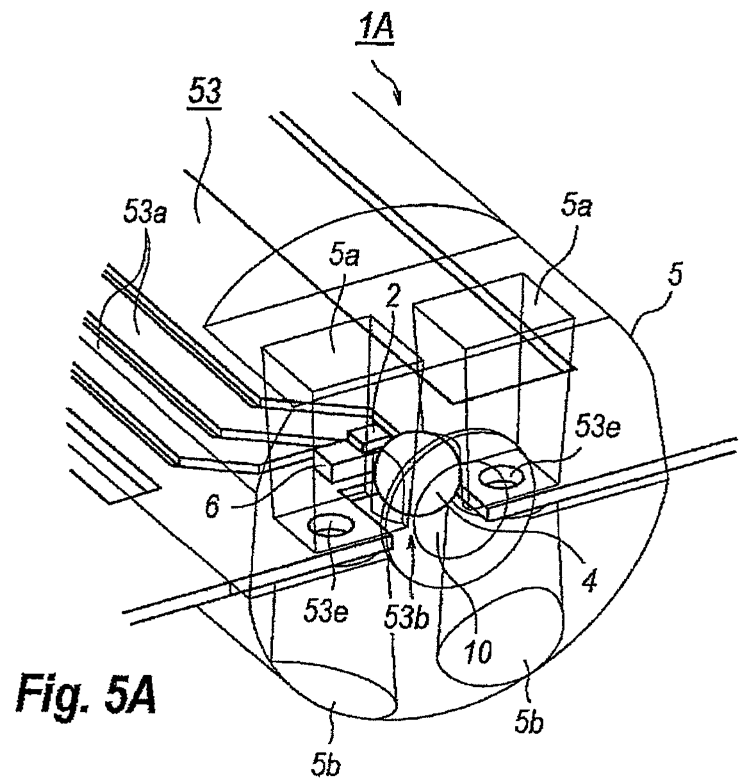
FIG. 5A is a perspective view of another optical module according to the second embodiment of the present invention, and FIG. 5B magnifies a primary portion of the optical module shown in FIG. 5A.
Figure 5B:
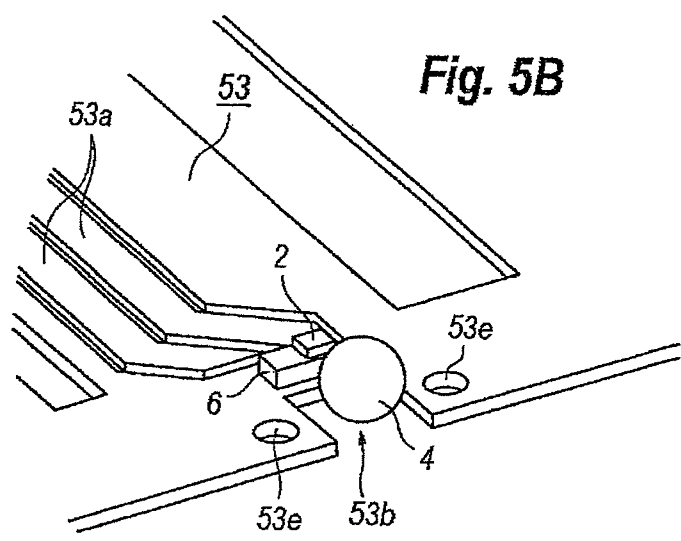

Next, another optical module according to the second embodiment of the present invention will be described as referring to FIGS. 5A and 5B, where FIG. 5A magnifies a primary portion of the optical module 1A, while, FIG. 5B removes the sealant 5 shown in FIG. 5A. The optical module 1A shown in FIGS. 5A and 5B also includes, as those of the aforementioned module 1, an LD 2, a lead frame 53, a lens 4 and a sealant 5. The lead frame 53 mounts the LD 2 thereon and has a cut 53*b* in one end thereof within which the lens 4 is installed. The lead frame 53 also has two holes 53*e* in both sides of the cut 53*b* putting the optical axis of the LD 2 and the lens 4 therebetween. The objects of the holes 53*e* will be described later in this specification.

In the present embodiment, the vias for arranging the lens 4 are formed such that the upper side of the sealant 5 with respect to the lead frame 3 has two vias 5*a* with a rectangular cross section in both sides of the lens so as to continue to the holes 53*e*; while, the lower side of the sealant 5 also has two vias 5*b* but with a circular cross section so as to continue to the holes 53*e*. These vias, 5*a* and 5*b*, may be formed during the molding to form the sealant 5. The sealant 5 of the present embodiment also installs a lens portion 10 in an outer surface crossing the optical axis of the LD 2 and the lens 4. The lens portion 10 is a type of the aspherical lens whose optical axis is aligned with the axis of the lens 4.

A method to form the sealant 5, that is a method to encapsulate the LD 2 and the lens 4, will be described.

Figure 6:
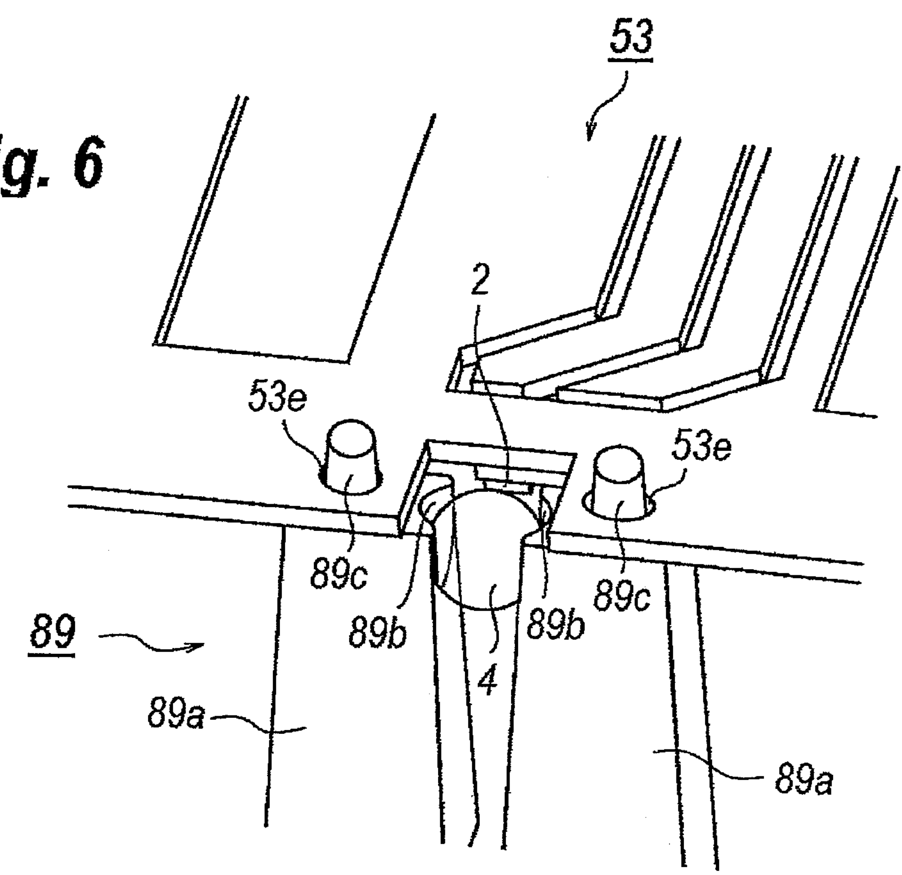
FIG. 6 shows a process to form the optical module shown in FIG. 5A.

FIG. 6 is a process to mold the sealant 5 according to the present embodiment. FIG. 6 views the lens 4 and the lead frame 53 from the lower side thereof, that is, FIG. 6 shows a back surface of the lead frame 53, where the lead frame 53 is set within the molding die including the upper die 89 and the lower die, the latter of which is not illustrated in FIG. 6.

The upper die 89 shown in FIG. 6 has two positioning pins 89*a* each having a hollow 89*b* in an end portion thereof. The hollow 89*b* in respective positioning pins 89*a* faces to each other. The bottom portion of the hollow 89*b* is spherical so as to fit the outer shape of the lens 4; accordingly, the positioning pins 89*a* may securely support the lens 4 during the transfer molding. A top of the positioning pin 89*a* has a projection 89*c* to be inserted within the hole 53*e* of the lead frame 53 to align the positioning pins 89*a* with the LD 2 on the lead frame 53.

The lower die also provides two positing pins having a truncated cone shape such as those shown in FIG. 3. The top of the positioning pin of the lower die forms a hole that receives the projection 89*c* of the upper positioning pin 89*a*. Thus, the upper positioning pin 89*a* may be securely aligned with the lead frame 53 during the molding. The surface of the upper and lower positioning pins are processed in water repellant to enhance the detachment of the molding from the sealant 5 after the molding.

The method to form the sealant 5 according to the present embodiment will be described. The process first sets the lens 4 within the hollow 89*b* of the upper positioning pin 89*a*, then sets the lead frame 53, on which the LD 2 is mounted through the sub-mount 6, on the upper positioning pin 89*a* so as to insert the projection 89*c* into the hole 53*e*. The lens 4 may be optically aligned with the LD 2 on the lead frame 53. Then, the lower die is joined with the upper die 89 such that the hole in the top of the lower positioning pin engages with the projection 89*c* of the upper positioning pin 89*a*; thus, the lead frame 53 may be securely supported between two dies. Finally, the process injects a transparent resin within the cavity formed between two dies. Conditions of the molding are substantially same as those of the former embodiment.

Figure 7A:
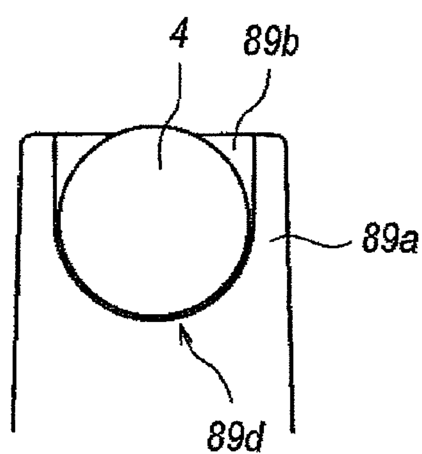
FIG. 7A is a side view showing a positioning pin and a lens according to the second embodiment of the invention.
Figure 7B:
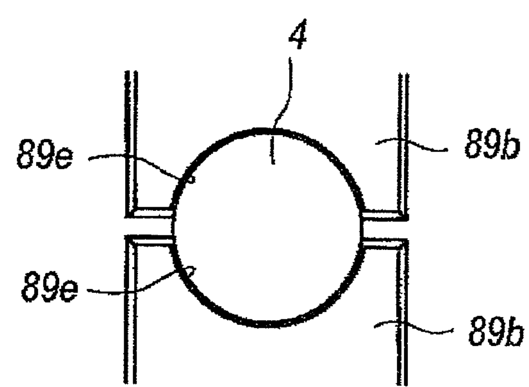
FIG. 7B shows the lens put between the positioning pins during the molding.

FIG. 7A magnifies a tip of the upper positioning pin 89*a* viewed from the side thereof, while, FIG. 7B shows two upper positioning pins 89*a* putting the lens 4 therebetween to support it during the molding, which is viewed from the top of the positioning pin 89*a*. As shown in FIG. 7A, the bottom portion 89*d* of the hollow 89*b* has a spherical shape to fit the outer shape of the lens 4. Moreover, the side 89*e* of the hollow 89*b* also has a spherical shape to fit the outer shape of the lens 4. Thus, the tip of the positioning pin 89*a* may securely support the lens 4 during the molding by the shape fitting the outer shape of the lens 4. The positioning pin 89*a* according to the present embodiment includes two spherical surfaces, 89*d* and 89*e*, within the hollow 89*b*; however, the positioning pin 89*a* may have only one of the spherical surfaces, 89*d* and 89*e*, to support the lens 4.

Figure 8A:
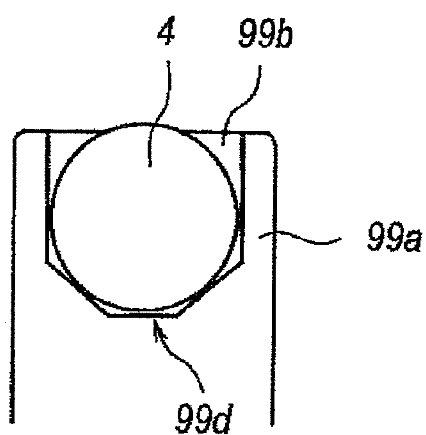
FIG. 8A shows a modified embodiment of the positioning pin.
Figure 8B:
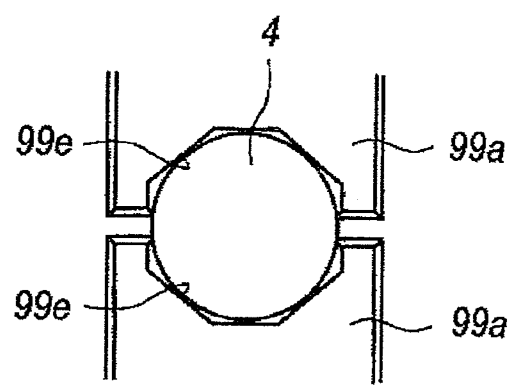
FIG. 8B shows the process for supporting the lens between the positioning pins.

FIGS. 8A and 8B magnify the tip portion of the upper positioning pin according to a modified embodiment of the invention. The upper positioning pin 99*a* of the modified embodiment has a hollow 99*b* in the tip thereof but the hollow 99*b* includes a plurality of plane surfaces in a bottom portion thereof, that is, the vertical cross section thereof shown in FIG. 8A is polygonal. At least three surfaces of the hollow 99*b* may come in contact with the lens 4 so as to support it securely. Moreover, as shown in FIG. 8B, the hollow 99*b* may have a horizontal polygonal shape with a plurality of plane surfaces, at least three of which come in contact with the lens 4. Thus, the arrangement of the hollow 99*b* according to the modified embodiment may securely support the lens 4 during the molding. The polygonal shape is not restricted to those illustrated in FIGS. 8A and 8B. For instance, a V-shaped groove may also support the lens, where two surfaces come in contact with the lens 4. Moreover, at least one of the bottom portion and the side portion of the hollow 99*b* may have a polygonal shape to support the lens 4.

The molding process thus described may securely support the lens 4 which is encapsulated by the resin during the molding by two positioning pins, which are parts of the molding dies; accordingly, the lens may be hardly affected in the position thereof by the fluid resin and may maintain the optical alignment with respect to the LD 2 on the lead frame 53.

Also in the present embodiment, metal members, such as copper or aluminum, may fill the vias, 5*a* and 5*b*, in the sealant 4 after the molding to enhance the heat dissipation from the LD 2 through the sealant 5 and the metal members in the vias, 5*a* and 5*b*. The present embodiment provides four vias close to the LD 2, which further enhances the heat dissipation comparing with those of the former embodiment that has two vias.

The optical module 1 according to the present embodiment may consider the temperature dependence of the refractive index of the lens 4 and that of the sealant 5, because the refractive index slightly shifts, depending on the temperature, the focal point and resultant optical coupling efficiency between the LD 2 and the external fiber. Accordingly, the optical module 1 designs the distance $L_{1a}$ from the LD 2 to the lens 4, another distance $L_{1b}$ from the lens 4 to the lens portion 10 of the sealant 5, and the radius R of the lens portion 10 according to the refractive index and the diameter of the lens 4.

Various dimensional conditions of the lens 4, the lens portion 10 and the LD 2 were verified under a wide range of the temperature by the optical coupling loss ΔPf and the tracking error (T.E) thereof as indices. The T.E. means a ratio of the maximum to the minimum of the optical coupling efficiency within a temperature range from −40 to 95° C., and preferably to be less than 0.5 dB. Table 1 shows the result of the T.E. under conditions where the emission wavelength of the LD 2 is 1310 nm, the refractive index of the resin for the sealant 5 is 1.51 at 25° C. with a thermal co-efficient of $-1.3\times10^{-4}$/° C., and the core diameter of the external fiber exposed in the tip end of the ferrule is 10 μm.

The evaluation described below first assumes the diameter of the lens 4 from 0.4 to 1.8 mm; then other dimensional parameters of distances, $L_{1a}$, $L_{1b}$ and $L_2$, and the radius R of the lens portion 10 are selected such that the optical coupling between the LD 2 and the external fiber at the tip end becomes a maximum.

TABLE I

| D(mm) | 0.4 | 0.6 | 0.8 | 1.0 | 1.2 | 1.8 |
|---|---|---|---|---|---|---|
| $L_{1a}$(mm) | 0.174 | 0.227 | 0.311 | 0.379 | 0.428 | 0.603 |
| $L_{1b}$(mm) | 0.465 | 0.350 | 0.541 | 0.583 | 0.446 | 0.407 |
| R(mm) | 0.30 | 0.36 | 0.50 | 0.60 | 0.65 | 0.90 |
| $L_2$(mm) | 1.404 | 1.760 | 2.425 | 2.934 | 3.240 | 4.553 |
| T.E.(dB) | 1.51 | 0.049 | 0.43 | 0.34 | 0.31 | 0.16 |
| ΔPf | average | good | good | good | good | bad |

In the whole evaluations, a material of the lens preferably has the refractive index thereof greater than that of the sealant 5. In the present embodiment, the lens 4 may be made of TaF3 whose refractive index is 1.78. The results are:

(1) a lens with a diameter D less than 0.6 mm is not only hard to be placed on the top of the positioning pin or put between the pins but easily misaligned during the molding due to the lightness thereof, even the optical modules shows a moderate or average loss for the optical coupling ΔPf; and (2) oppositely, a lens with a diameter of 1.8 mm or greater accompanies with greater dimensional parameters, $L_{1a}$, $L_{1b}$ and $L_2$, which requests the longer sleeve even if the precise optical alignment of the lens 4 becomes available.

The longer sleeve inherently shows less tolerance during the assembly thereof; in particular, when such a sleeve is fixed with an adhesive, the optical alignment is easily deformed. The table 1 above shows a relatively better tracking error T.E. for case of the lens diameter of 1.8 mm; however, the optical coupling ΔPf was unacceptable. Accordingly, a lens 4 for the optical module 1 of the invention preferably has a diameter from 0.6 to 1.2 mm.

While several embodiments and variations of the present invention are described in detail herein, it should be apparent that the disclosure and teachings of the present invention will suggest many alternative designs to those skilled in the art.

We claim:

1. An optical module, comprising:

a semiconductor optical device;

a lead frame for mounting said semiconductor optical device, said lead frame having a cut;

a lens optically coupled with said semiconductor optical device, said lens being set within said cut of said lead frame; and a sealant for enclosing said semiconductor optical device, said lens and a portion of said lead frame, said sealant being transparent for light characterizing said semiconductor optical device, wherein said sealant has at least a via penetrating from a surface of said sealant to said lens.

2. The optical module of claim 1, wherein said via has a cross section of a truncated cone.

3. The optical module of claim 1, wherein said via has a cross section of a trapezoid.

4. The optical module of claim 1, wherein said via is filled with a metal.

5. The optical module of claim 1, wherein said sealant has an optically active outer surface in a portion crossing an axis connecting said semiconductor optical device to said lens.

6. The optical module of claim 1, wherein said sealant has a pair of vias putting an axis connecting said semiconductor optical device with said lens therebetween.

7. The optical module of claim 1, wherein said via passes through said sealant to expose said lens in a midway of said via.

* * * * *